United States Patent
Huang et al.

(10) Patent No.: US 9,743,566 B2
(45) Date of Patent: Aug. 22, 2017

(54) CLAD TYPE ELECTROMAGNETIC SHIELDING MATERIAL AND METHOD FOR MANUFACTURING THE SAME

(71) Applicant: METAL INDUSTRIES RESEARCH & DEVELOPMENT CENTRE, Kaohsiung (TW)

(72) Inventors: Chien-Sin Huang, Kaohsiung (TW); Chung-Chen Huang, Kaohsiung (TW); Chien-Hung Huang, Kaohsiung (TW); Chin-Chuan Huang, Kaohsiung (TW)

(73) Assignee: METAL INDUSTRIES RESEARCH & DEVELOPMENT CENTRE, Kaohsiung (TW)

( * ) Notice: Subject to any disclaimer, the term of this patent is extended or adjusted under 35 U.S.C. 154(b) by 492 days.

(21) Appl. No.: 14/307,904

(22) Filed: Jun. 18, 2014

(65) Prior Publication Data
US 2015/0156930 A1   Jun. 4, 2015

(30) Foreign Application Priority Data

Nov. 29, 2013   (TW) .............................. 102143689 A (51) Int. Cl.
*B21B 1/38* (2006.01)
*B23K 20/04* (2006.01)
*H05K 9/00* (2006.01)

(52) U.S. Cl.
CPC ............. *H05K 9/0088* (2013.01); *B21B 1/38* (2013.01); *B23K 20/04* (2013.01); *Y10T 29/49117* (2015.01); *Y10T 428/12361* (2015.01); *Y10T 428/12444* (2015.01); *Y10T 428/12556* (2015.01)

(58) Field of Classification Search
CPC .................................................. H05K 9/0088
See application file for complete search history.

(56) References Cited

U.S. PATENT DOCUMENTS

| 4,774,148 A | * | 9/1988 | Goto | B32B 15/04 428/607 |
| 4,810,589 A | * | 3/1989 | Kuwamoto | C21D 8/1233 148/320 |
| 4,965,408 A | * | 10/1990 | Chapman | B32B 15/08 174/363 |

(Continued)

FOREIGN PATENT DOCUMENTS

| JP | 2005228939 A | * | 8/2005 |
| WO | 2011068695 A1 | | 6/2011 |

OTHER PUBLICATIONS

JP 2005228939 A—Machine translation.*

*Primary Examiner* — Devang R Patel
(74) *Attorney, Agent, or Firm* — WPAT, PC (57) ABSTRACT

A method for manufacturing a clad type electromagnetic shielding material includes step as follows: a first electrically conductive metallic layer, a magnetically conductive metallic layer, a second electrically conductive metallic layer and a shock-absorbing insulation layer, which are stacked in order, are one-time continuously rolled by a clad type rolling process, so as to finish a clad plate applied to an electromagnetic shielding field, wherein the surface of the shock-absorbing insulation layer provided with a binder faces the second electrically conductive metallic layer.

11 Claims, 5 Drawing Sheets

(56) References Cited

U.S. PATENT DOCUMENTS

| | | | | |
|---|---|---|---|---|
| 5,244,708 A | * | 9/1993 | Tsuchida | B32B 15/08 174/391 |
| 5,709,957 A | * | 1/1998 | Chiang | C23C 14/024 428/469 |
| 7,351,479 B2 | * | 4/2008 | Funkenbusch | H05K 9/0094 174/51 |
| 2005/0233132 A1 | * | 10/2005 | Kojima | H05K 9/0096 428/328 |
| 2008/0283290 A1 | * | 11/2008 | Niino | H05K 9/0001 174/350 |
| 2015/0342099 A1 | * | 11/2015 | Jang | H01Q 17/00 174/350 |

* cited by examiner

CLAD TYPE ELECTROMAGNETIC SHIELDING MATERIAL AND METHOD FOR MANUFACTURING THE SAME

CROSS-REFERENCE TO RELATED APPLICATION

This application claims the benefit of Taiwan Patent Application No. 102143689, filed on Nov. 29, 2013, which is hereby incorporated by reference for all purposes as if fully set forth herein.

BACKGROUND

Technical Field

The present invention relates to an electromagnetic shielding material and a method for manufacturing the same, and in particular to a clad plate which is formed by a rolled metallic layer and a shock-absorbing insulation layer and a method for manufacturing the clad plate.

Related Art

The electromagnetic shielding principle is that: an electrically conductive material or a magnetically conductive material is disposed in a space for decreasing the extension of a magnetic field from the space to another space. It is called as an electromagnetic shielding effectiveness, because the electromagnetic shielding material can decrease the energy of the magnetic field. The electromagnetic shielding design of electronic and electrical products is either the control of a system circuit design or a material design. According the shells of the electronic and electrical products, the weight, the heat dispersion, structural strength, etc., can be also considered except the electromagnetic shielding effectiveness.

Figure 1:
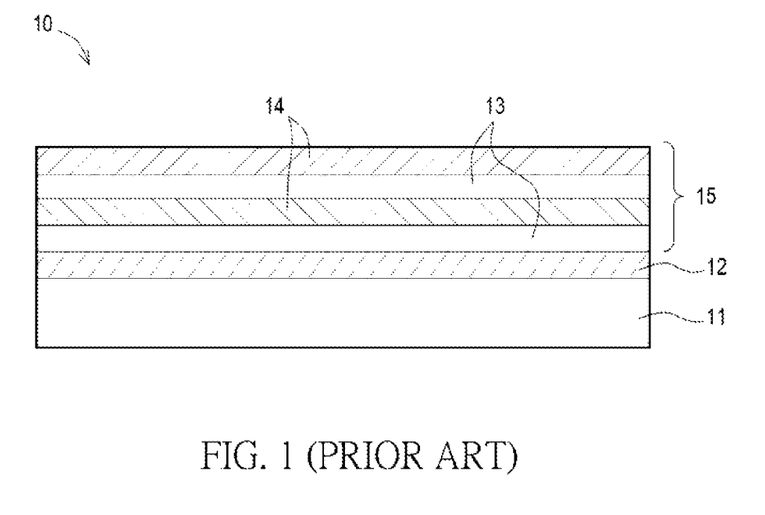
FIG. 1 is a cross-sectional views of an electromagnetic shielding material in the prior art.

FIG. 1 shows a conventional electromagnetic shielding material, for example, the World Intellectual Property Organization (WIPO) patent publication number WO2011068695 A1 discloses a multi-layer electromagnetic interference (EMI) shielding material 10 having high radio frequency (RF) magnetically conductive property. The EMI shielding material 10 includes a flexible substrate 11, a first ferromagnetic material layer 12 and a multi-layer stack 15. The first ferromagnetic material layer 12 has high magnetically conductive property, and is disposed on the flexible substrate 11. The multi-layer stack 15 is disposed on the first ferromagnetic material layer 12. The multi-layer stack 15 includes a plurality of bi-layer couples, which each includes a polymer separating layer 13 and a second ferromagnetic material layer 14 disposed on the polymer separating layer 13. At least one or more of the polymer separating layers 13 include acrylic polymer. The layers of the EMI shielding material 10 must be bonded together by an adhesively connection or a mechanically connection, wherein a ferromagnetic material layer is provided with a binding layer, and the bonding region between the ferromagnetic material layer and the binding layer has higher thermo resistance, i.e., worse heat dispersion.

SUMMARY

Accordingly, the objective of the present invention is to provide a clad type electromagnetic shielding material and a method for manufacturing the same, wherein a flexible electrically conductive metallic layer is mechanically and metallurgically bonded with a magnetically conductive e metallic layer by a rolling technology, and then they are bound (i.e., adhered) with a shock-absorbing insulation layer, so as to finish the clad type electromagnetic shielding material.

To achieve the above-mentioned objective, the present invention provides a method for manufacturing a clad type electromagnetic shielding material, the method including the following steps of: providing a first electrically conductive metallic layer, a magnetically conductive metallic layer, a second electrically conductive metallic layer and a shock-absorbing insulation layer, wherein the shock-absorbing insulation layer has a binder located on a surface of the shock-absorbing insulation layer; and one-time continuously rolling the first electrically conductive metallic layer, the magnetically conductive metallic layer, the second electrically conductive metallic layer and the shock-absorbing insulation layer, which are stacked in order, by a clad type rolling process, so as to finish a clad plate, wherein the surface of the shock-absorbing insulation layer provided with the binder faces the second electrically conductive metallic layer.

In an embodiment, the material of the first electrically conductive metallic layer is made of copper, the material of the second electrically conductive metallic layer is made of aluminum, the material of the magnetically conductive metallic layer is made of iron, stainless steel or silicon steel, and the material of the shock-absorbing insulation layer is made of high polymer material. The magnetically conductive metallic layer is a thin iron plate having a plurality of holes or is an iron wire mesh.

In an embodiment, before the clad type rolling process, the method for manufacturing the clad type electromagnetic shielding material further includes a preprocessing temperature control step of: heating the first electrically conductive metallic layer, the magnetically conductive metallic layer, the second electrically conductive metallic layer and the shock-absorbing insulation layer, which are stacked in order, to a temperature range between 150 and 200 degrees centigrade; and after the clad type rolling process, the method for manufacturing the clad type electromagnetic shielding material further includes a reprocessing temperature control step of: annealing the clad plate in an annealing process, for example.

To achieve the above-mentioned objective, the present invention further provides a clad type electromagnetic shielding material applied to an electromagnetic shielding design of electronic and electrical products, the clad type electromagnetic shielding material including a first electrically conductive metallic layer, a magnetically conductive metallic layer, a second electrically conductive metallic layer and a shock-absorbing insulation layer, which are stacked in order and rolled to a clad plate by a rolling process, wherein after the rolling process the first electrically conductive metallic layer, the magnetically conductive metallic layer and the second electrically conductive metallic layer are mechanically and metallurgically bonded together, and after the rolling process the shock-absorbing insulation layer is also bonded with the second electrically conductive metallic layer, because the shock-absorbing insulation layer has a binder located on a surface of the shock-absorbing insulation layer which faces the second electrically conductive metallic layer.

The technical feature of the present invention is that: a clad type rolling process (which has better controlled rolling and heating properties) is utilised to bond metallic layers and a high polymer layer, the interface resistance between the metallic layers is very low because of mechanical and metallurgical bond, each metallic layer can be controlled to achieve the uniform bonding strength and a stable thickness so as to achieve the electromagnetic shielding effect, and the high polymer layer is bonded without a subsequent anodizing treatment, such that the clad type rolling process is a kind of green environmental process. In addition, the present invention can get an optimized design by using various materials and various thicknesses in accordance with different frequency range of the electromagnetic shielding effect. For example, copper metallic layer can provide the heat dispersion and the electromagnetic shielding effect, a magnetically conductive metallic mesh (or plate) can provide the structural strength and the electromagnetic shielding effect, aluminum metallic layer can provide the light weight and the electromagnetic shielding effect, and the high polymer layer can provide the shock-absorbing property and electrical insulation. Thus, according to the clad type electromagnetic shielding material of the present invention, the electromagnetic shielding effect, the light weight, the heat dispersion, the structural strength and the shock-absorbing property can be considered simultaneously.

To make the aforementioned and other objects, features and advantages of the present invention clearer, detailed illustration is provided in the following with reference to the accompanying drawings.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

Embodiments accompanied with figures of the present invention are described in detail below.

Figure 2:
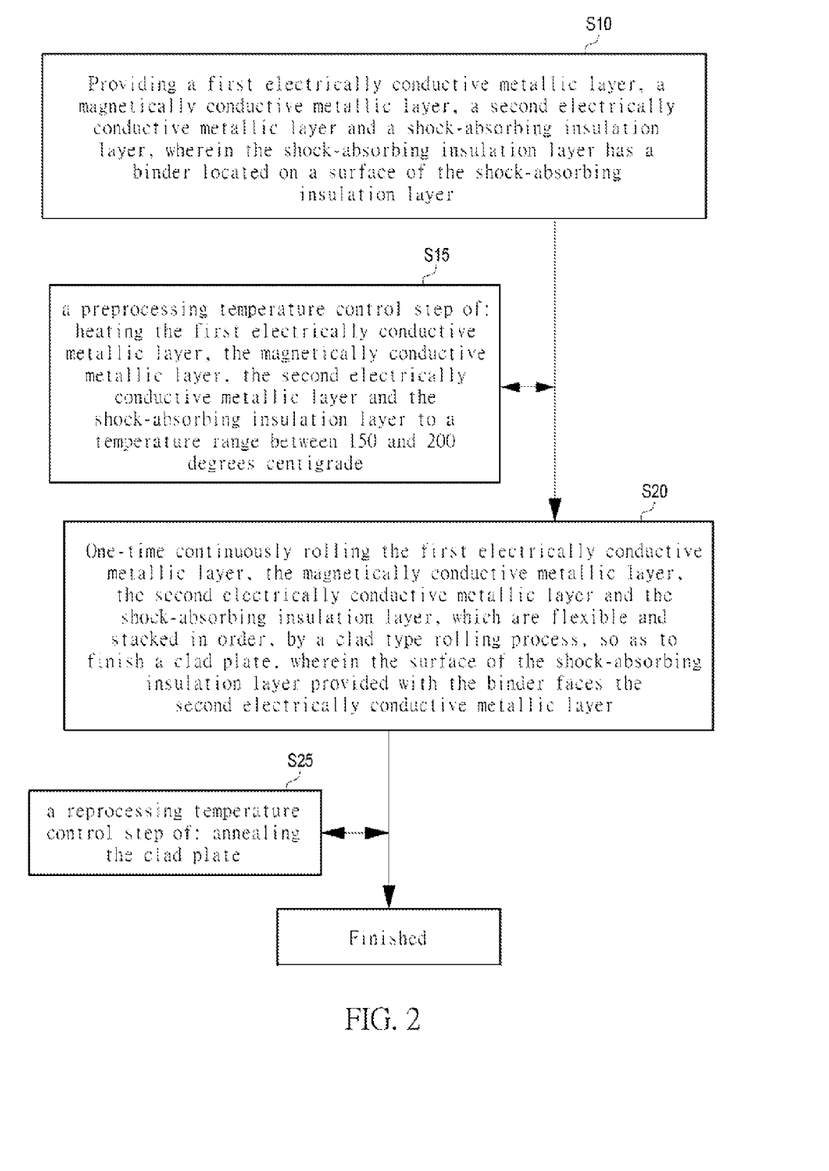
FIG. 2 is a flow chart of a method for manufacturing a clad type electromagnetic shielding material according to an embodiment of the present invention.
Figure 3:
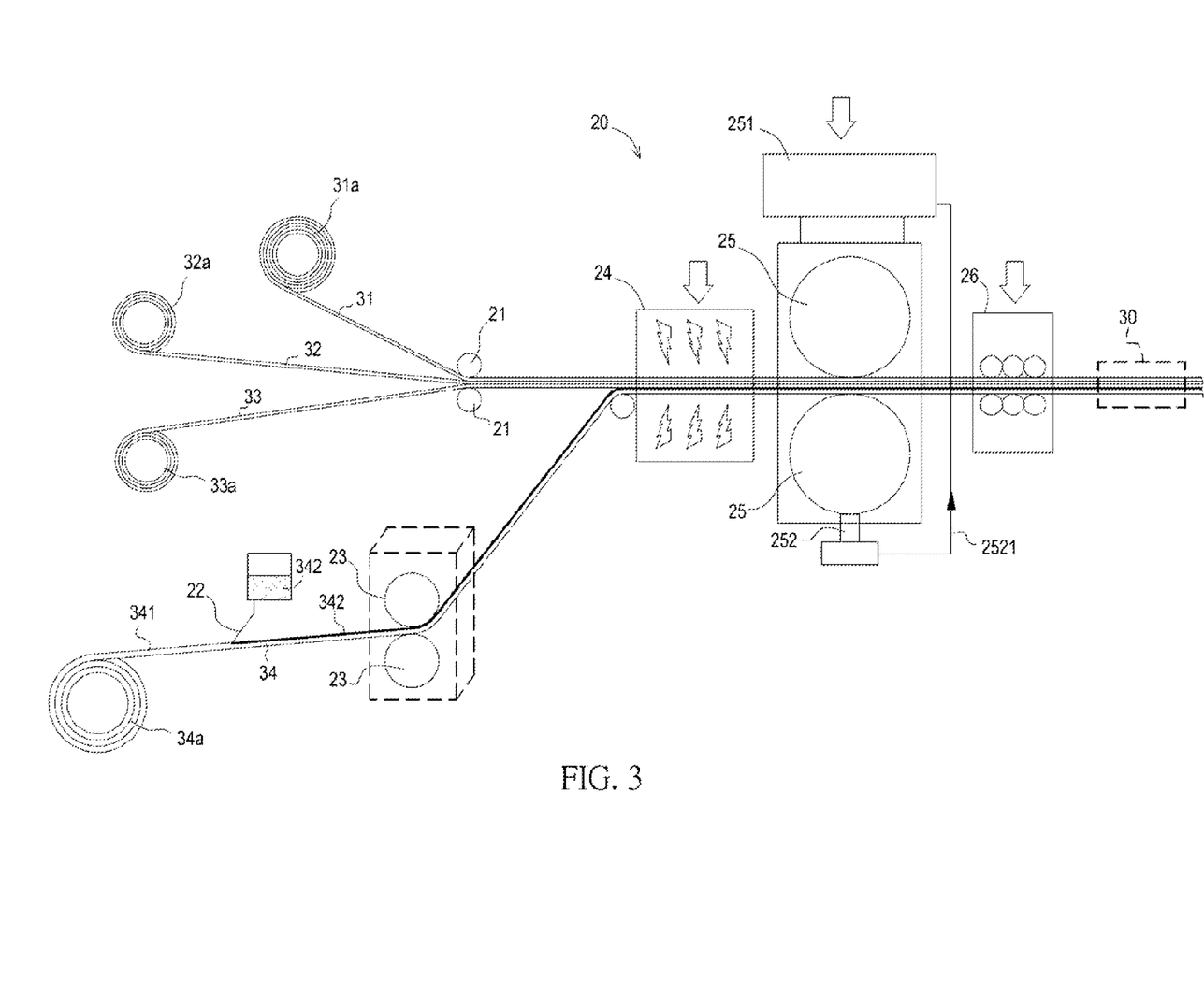
FIG. 3 is a schematic view showing a rolling process of a clad type electromagnetic shielding material according to an embodiment of the present invention.

FIG. 2 is a flow chart of a method for manufacturing a clad type electromagnetic shielding material according to an embodiment of the present invention, and FIG. 3 is a schematic view showing a rolling process of a clad type electromagnetic shielding material according to an embodiment of the present invention. The method in this embodiment includes steps as follows:

In step S10, a first electrically conductive metallic layer 31 (which is flexible and supplied from a first electrically conductive metallic roll 31a), a magnetically conductive metallic layer 32 (which is supplied from a magnetically conductive metallic roll 32a), a second electrically conductive metallic layer 33 (which is supplied from a second electrically conductive metallic roll 33a), and a shock-absorbing insulation layer 34 (which is supplied from a shock-absorbing insulation roll 34a) are provided, wherein the shock-absorbing insulation layer 34 has a binder 342 located on a surface of the shock-absorbing insulation layer 34.

In step S20, the first electrically conductive metallic layer 31, the magnetically conductive metallic layer 32, the second electrically conductive metallic layer 33 and the shock-absorbing insulation layer 34, which are stacked in order, are one-time continuously rolled by a clad type rolling process, so as to finish a clad plate (i.e., the clad type electromagnetic shielding material 30 of the present invention), wherein the surface of the shock-absorbing insulation layer 34 provided with the binder 342 faces the second electrically conductive metallic layer 33.

The above-mentioned clad type rolling process can be carried out by a person ordinarily skilled in the art. Generally, a rolling mill 20 is utilised to carry out a rolling process, i.e., flexible plate material blanks are conveyed and rolled by a plurality of roller sets, shown in FIG. 3. In an embodiment of the present invention, the precision of the rotational speed of the rollers can be ±1 rpm in the rolling process, whereby the flatness of the rolled plate material (i.e., the clad plate) is 8 I-UNIT. More detailed, the rolling mill 20 has a roller 25, the roller 25 is provided with a pressing mechanism 251 and a pressure sensor 252, a rolling force of the rolling mill 20 is adjusted by the pressure sensor 252 according to a feedback pressure signal during the press of the pressing mechanism 251. In an embodiment of the present invention, the rolling force can be 500±5 kg, whereby the thickness of the clad plate is controlled within 10% of an original thickness.

In addition, in an embodiment, the material of the first electrically conductive metallic layer 31 is made of copper, the material of the second electrically conductive metallic layer 33 is made of aluminum, the material of the magnetically conductive metallic layer 32 is made of iron, stainless steel or silicon steel, and the material of the shock-absorbing insulation layer 34 is made of high polymer material.

Referring to FIG. 3 again, in a further embodiment, before the clad type rolling process the first electrically conductive metallic layer 31, the magnetically conductive metallic layer 32 and the second electrically conductive metallic layer 33 can be stacked to be a stacking plate in advance by a pair of guide roller 21, and then the shock-absorbing insulation layer 34 is stacked on the stacking plate. The shock-absorbing insulation layer 34 is a flexible substrate 341 made of high polymer material which can be coated with the binder 342 in advance. More detailed, before the shock-absorbing insulation layer 34 is bound (i.e., adhered) with the stacking plate, a surface of the flexible substrate 341 which faces the second electrically conductive metallic layer 33 is coated (or sprayed) with the binder 342 in advance by a binder nozzle 22, and then the thickness of the binder 342 is approximately controlled to 0.1±0.02 mm by a binder-thickness adjusting roller set 23.

To deserve to be mentioned, before the clad type rolling process, the method for manufacturing the clad type electromagnetic shielding material further includes a preprocessing temperature control step S15: heating the first electrically conductive metallic layer 31, the magnetically conductive metallic layer 32, the second electrically conductive metallic layer 33 and the shock-absorbing insulation layer 34, which are stacked in order, to a temperature range between 150 and 200 degrees centigrade. A heating furnace 24 which is disposed at the production line of the clad plate can be used in a heating process of the preprocessing temperature control step S15. After the clad type rolling process, the method for manufacturing the clad type electromagnetic shielding material further includes a reprocessing temperature control step S25: annealing the clad plate 30 in an annealing process by an annealing furnace 26 which is disposed at the production line of the clad plate, for example.

Figure 4:
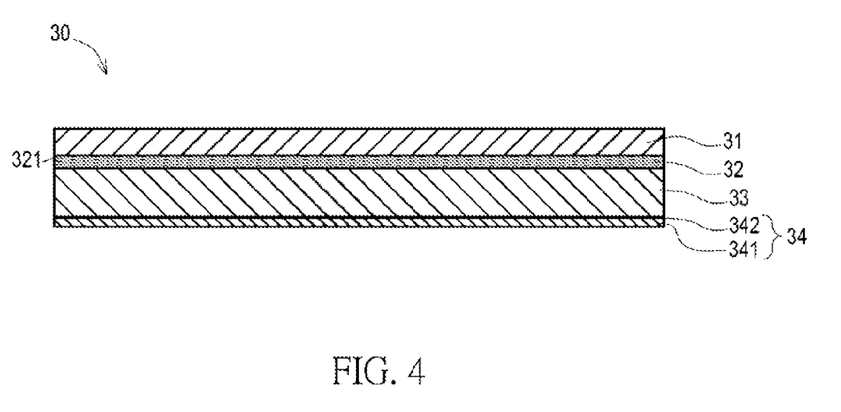
FIG. 4 is a cross-sectional view of a clad type electromagnetic shielding material according to an embodiment of the present invention.

FIG. 4 is a cross-sectional view of a clad type electromagnetic shielding material according to an embodiment of the present invention. The clad type electromagnetic shielding material in this embodiment is rolled to a clad plate, which includes a first electrically conductive metallic layer 31, a magnetically conductive metallic layer 32, a second electrically conductive metallic layer 33 and a shock-absorbing insulation layer 34, which are stacked in order, wherein after the rolling process the first electrically conductive metallic layer 31, the magnetically conductive metallic layer 32 and the second electrically conductive metallic layer 33 are mechanically and metallurgically bonded together, and after the rolling process the shock-absorbing insulation layer 34 is also bonded with the second electrically conductive metallic layer 33.

In an embodiment, the magnetically conductive metallic layer 32 is a thin iron plate having a plurality of holes or is an iron wire mesh, whereby after the rolling process the magnetically conductive metallic layer 32 can be extended in a direction parallel to a surface thereof, so as to increase the electromagnetic shielding density.

Figure 5:
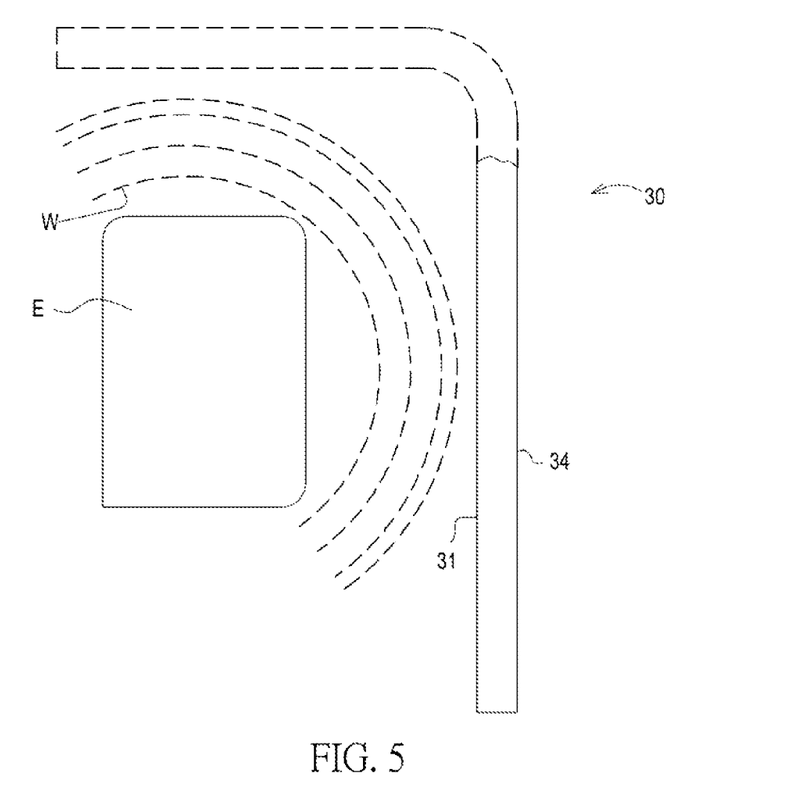
FIG. 5 is a schematic view showing an example of a clad type electromagnetic shielding material according to an embodiment of the present invention.

FIG. 5 is a schematic view showing an example of a clad type electromagnetic shielding material according to an embodiment of the present invention. The first electrically conductive metallic layer 31 of the clad type electromagnetic shielding material 30 faces electronic and electrical products E which generate electromagnetic waves W during the use of the clad type electromagnetic shielding material 30. Also, each layers of the clad type electromagnetic shielding material 30 is flexible, and thus the clad type electromagnetic shielding material 30 is also flexible so as to meet the curved requirement.

As described above, advantages of the present invention is that: electromagnetic waves having frequency being higher than 300 MHz is in the form of an electric field, electromagnetic waves having frequency being lower than 300 MHz is in the form of an magnetic field, the present invention including the high electrically conductive metallic layers (e.g., copper and aluminum) utilises eddy current to generate opposite magnetic field, the opposite magnetic field neutralizes original electromagnetic field, a low resistance closed circuit is formed in the high magnetically conductive metallic layer (e.g., iron), whereby most magnetic field gathers and flows in the clad type electromagnetic shielding material so as to achieve the objective of absorbing and weakening electromagnetic waves. According to Faraday's law of induction, when a conductor senses changes of an electromagnetic wave, a voltage can be induced in the conductor. When an electromagnetic wave is transmitted to the clad type electromagnetic shielding material of the present invention, a voltage can be induced in the conductor, the voltage induces another opposite magnetic field, and the opposite magnetic field neutralizes original magnetic field. When the electromagnetic wave reaches the first electrically conductive metallic layer of the clad type electromagnetic shielding material, a part of the incident electromagnetic wave can be reflected by the first electrically conductive metallic layer, and thus the other part of the incident electromagnetic wave which is not reflected enters the first electrically conductive metallic layer. When the remaining electromagnetic wave reaches the magnetically conductive metallic layer, the remaining electromagnetic wave is weakened by the magnetically conductive metallic layer (e.g., high magnetically conductive metallic plate or mesh), in other words, a part of the remaining electromagnetic wave is absorbed by the magnetically conductive metallic layer. When the other part of the remaining electromagnetic wave which are not absorbed reaches the second electrically conductive metallic layer (e.g., high electrically conductive metallic layer) of the clad type electromagnetic shielding material, some of the remaining electromagnetic wave can be reflected again by the electrically conductive metallic layer, and thus the some of the remaining electromagnetic wave which are reflected return to the magnetically conductive metallic layer again. Thus, multi reflections are possibly generated between the first and second electrically conductive metallic layers so as to achieve the electromagnetic shielding effect. The present invention utilises a clad type rolling process (which has better controlled rolling and heating properties) to bond metallic layers and a high polymer layer, the interface resistance between the metallic layers is very low because of mechanical and metallurgical bond, each metallic layer can be controlled to achieve the uniform bonding strength and a stable thickness so as to achieve the electromagnetic shielding effect, and the high polymer layer is bonded without a subsequent anodizing treatment, such that the clad type rolling process is a kind of green environmental process. In addition, the present invention can get an optimized design by using various materials and various thicknesses in accordance with different frequency range of the electromagnetic shielding effect. For example, aluminum metallic layer can provide the light weight and the electromagnetic shielding effect, copper metallic layer can provide the heat dispersion and the electromagnetic shielding effect, a magnetically conductive metallic mesh (or plate) can provide the structural strength and the electromagnetic shielding effect, and the high polymer layer can provide the shock-absorbing property and electrical insulation. Thus, according to the clad type electromagnetic shielding material of the present invention, the electromagnetic shielding effect, the light weight, the heat dispersion, the structural strength and the shock-absorbing property can be considered simultaneously.

In conclusion, described in the foregoing are merely implementation manners or embodiments for presenting the technical means employed in the present invention for solving the problems, and these implementation manners or embodiments are not intended to limit the implementation scope of the present invention. Any equivalent change and modification made in consistency with the content of the scope of the present invention of the patent application or in accordance with the scope of the present invention shall fall within the scope of the present invention.

What is claimed is:

1. A method for manufacturing a clad type electromagnetic shielding material, comprising the following steps of:
   providing a first electrically conductive metallic layer, a magnetically conductive metallic layer, a second electrically conductive metallic layer and a shock-absorbing insulation layer, wherein the shock-absorbing insulation layer has a binder located on a surface of the shock-absorbing insulation layer; and
   one-time continuously rolling the first electrically conductive metallic layer, the magnetically conductive metallic layer, the second electrically conductive metallic layer and the shock-absorbing insulation layer, which are flexible and stacked in order, by a clad type rolling process, so as to finish a clad plate, wherein the surface of the shock-absorbing insulation layer provided with the binder faces the second electrically conductive metallic layer,
wherein a precision of a rotational speed of rollers is ±1 rpm in the clad type rolling process, whereby a flatness of the clad plate is 8 I-UNIT.

2. The method according to claim 1, wherein the material of the first electrically conductive metallic layer is made of copper, the material of the second electrically conductive metallic layer is made of aluminum, the material of the magnetically conductive metallic layer is made of iron, stainless steel or silicon steel, and the material of the shock-absorbing insulation layer is made of high polymer material.

3. The method according to claim 2, wherein the magnetically conductive metallic layer is a thin iron plate having a plurality of holes or is an iron wire mesh.

4. The method according to claim 1, wherein before the clad type rolling process the first electrically conductive metallic layer, the magnetically conductive metallic layer and the second electrically conductive metallic layer are stacked in advance by a pair of guide roller, and then the shock-absorbing insulation layer is stacked.

5. The method according to claim 1, wherein before the clad type rolling process the shock-absorbing insulation layer is coated with the binder in advance by a binder nozzle, and then a thickness of the binder is controlled by a binder-thickness adjusting roller set.

6. The method according to claim 5, wherein the thickness of the binder is approximately controlled to 0.1±0.02 mm.

7. The method according to claim 1, wherein a thickness of the clad plate is controlled within 10% of an original thickness.

8. The method according to claim 7, wherein the rolling force is adjusted by a pressure sensor according to a feedback pressure signal.

9. The method according to claim 1, wherein before the clad type rolling process, the method for manufacturing the clad type electromagnetic shielding material further comprises a preprocessing temperature control step of: heating the first electrically conductive metallic layer, the magnetically conductive metallic layer, the second electrically conductive metallic layer and the shock-absorbing insulation layer, which are stacked in order, to a temperature range between 150 and 200 degrees centigrade.

10. The method according to claim 9, wherein a heating furnace is used in a heating process of the preprocessing temperature control step.

11. The method according to claim 9, wherein after the clad type rolling process, the method for manufacturing the clad type electromagnetic shielding material further comprises a reprocessing temperature control step of: annealing the clad plate in an annealing process.

* * * * *